US012684766B2

(12) United States Patent
Guo et al.

(10) Patent No.: US 12,684,766 B2
(45) Date of Patent: Jul. 14, 2026

(54) SEMICONDUCTOR DEVICE WITH STAIRCASE GATE STACK AND SIDEWALL ISOLATION STRUCTURE

(71) Applicant: Yangtze Memory Technologies Co., Ltd., Hubei (CN)

(72) Inventors: Zhen Guo, Hubei (CN); Wei Xu, Hubei (CN); Bin Yuan, Hubei (CN); Chuang Ma, Hubei (CN); Jiashi Zhang, Hubei (CN); ZongLiang Huo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 825 days.

(21) Appl. No.: 17/901,240

(22) Filed: Sep. 1, 2022

(65) Prior Publication Data

US 2024/0081051 A1 Mar. 7, 2024

(51) Int. Cl.
H01L 29/792 (2006.01)
G11C 16/04 (2006.01)
(Continued)

(52) U.S. Cl.
CPC ......... H10B 41/27 (2023.02); G11C 16/0483 (2013.01); H10B 41/35 (2023.02);
(Continued)

(58) Field of Classification Search
CPC ........ H10B 41/27; H10B 41/35; H10B 43/27; H10B 43/35; H10B 43/50; H10B 41/50;
(Continued)

(56) References Cited

U.S. PATENT DOCUMENTS 10,134,672 B2 * 11/2018 Inatsuka ............. H01L 23/5226
10,504,901 B2 * 12/2019 Yoo ................... H01L 21/76895
(Continued)

FOREIGN PATENT DOCUMENTS

TW 202238900 A 10/2022

OTHER PUBLICATIONS

Hemant P. Mungekar, Young S. Lee; High density plasma chemical vapor deposition gap-fill mechanisms. J. Vac. Sci. Technol. B Mar. 1, 2006; 24 (2): L11-L15. https://doi.org/10.1116/1.2178364 (Year: 2006).*

(Continued)

*Primary Examiner* — Leonard Chang
*Assistant Examiner* — Tsz K Chiu
(74) *Attorney, Agent, or Firm* — Oblon, McClelland, Maier & Neustadt, L.L.P.

(57) ABSTRACT

Aspects of the disclosure provide a semiconductor device. The semiconductor device includes a memory stack of gate layers and insulating layers. The gate layers and the insulating layers are stacked alternatingly and are formed into stair steps in a staircase region. The semiconductor device includes a first landing pad on a first gate layer of a first stair step. The first gate layer is a top gate layer of the first stair step. The semiconductor device further includes a first sidewall isolation structure on a riser sidewall of a second gate layer of a second stair step. The second gate layer is a top gate layer of the second stair step and is stacked on the first gate layer in the memory stack. The first sidewall isolation structure isolates the second gate layer from the first landing pad.

20 Claims, 15 Drawing Sheets

(51) Int. Cl.

| | |
|---|---|
| *H01L 27/1157* | (2017.01) |
| *H01L 27/11575* | (2017.01) |
| *H01L 27/11582* | (2017.01) |
| *H10B 41/27* | (2023.01) |
| *H10B 41/35* | (2023.01) |
| *H10B 43/27* | (2023.01) |
| *H10B 43/35* | (2023.01) |
| *H10W 90/00* | (2026.01) |

(52) U.S. Cl.
CPC ............. *H10B 43/27* (2023.02); *H10B 43/35* (2023.02); *H10W 90/00* (2026.01)

(58) Field of Classification Search
CPC ........ H10B 43/10; H10B 41/41; H10B 12/03; H10B 12/053; H10B 12/34; H10B 12/488; H10B 41/10; H10B 69/00; H10B 12/00; H10B 12/033; H10B 41/20; H10B 43/20; H10B 43/40; G11C 16/0483; H01L 25/0657
See application file for complete search history.

(56) References Cited

U.S. PATENT DOCUMENTS

| | | | | |
|---|---|---|---|---|
| 10,553,605 | B2 * | 2/2020 | Gu | H10B 43/50 |
| 10,700,089 | B1 * | 6/2020 | Hojo | H01L 21/31116 |
| 10,770,471 | B2 * | 9/2020 | Shimizu | H10B 43/50 |
| 11,309,325 | B2 * | 4/2022 | Ichinose | H10B 43/27 |
| 2001/0005628 | A1 * | 6/2001 | Inoue | H01L 21/76802 |
| | | | | 257/E21.585 |
| 2015/0255385 | A1 * | 9/2015 | Lee | H10B 43/50 |
| | | | | 257/775 |
| 2017/0084532 | A1 * | 3/2017 | Son | H01L 21/76877 |
| 2021/0013088 | A1 * | 1/2021 | Chen | H01L 24/94 |

OTHER PUBLICATIONS

Taiwanese Office Action issued on May 13, 2024 in the corresponding Taiwanese Application No. 111149584, 4 pages.

* cited by examiner

SEMICONDUCTOR DEVICE WITH STAIRCASE GATE STACK AND SIDEWALL ISOLATION STRUCTURE

TECHNICAL FIELD

The present application describes embodiments generally related to a memory system, semiconductor devices and fabrication processes for the semiconductor devices.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device includes a core region and a staircase region. The core region includes a stack of alternating gate layers and insulating layers. The stack of alternating gate layers and insulating layers is used to form memory cells that are stacked vertically. The staircase region includes the respective gate layers in the stair-step form to facilitate forming contacts to the respective gate layers. The contacts are used to connect driving circuitry to the respective gate layers for controlling the stacked memory cells.

SUMMARY

Aspects of the disclosure provide a semiconductor device. The semiconductor device includes a memory stack of gate layers and insulating layers. The gate layers and the insulating layers are stacked alternatingly and are formed into stair steps in a staircase region. The semiconductor device includes a first landing pad on a first gate layer of a first stair step. The first gate layer is a top gate layer of the first stair step. The semiconductor device further includes a first sidewall isolation structure on a riser sidewall of a second gate layer of a second stair step. The second gate layer is a top gate layer of the second stair step and is stacked on the first gate layer in the memory stack. The first sidewall isolation structure isolates the second gate layer from the first landing pad.

Further, according to an aspect of the disclosure, the semiconductor device includes a second landing pad on the second gate layer of the second stair step. A sidewall of the second landing pad is covered by a different isolation layer from the first sidewall isolation structure. In some examples, the different isolation layer is a contact isolation layer in the staircase region, and the contact isolation layer covers the first landing pad and the second landing pad. For example, the semiconductor device includes a first contact structure that extends through the contact isolation layer and is connected with the first gate layer of the first stair step, and includes a second contact structure that extends through the contact isolation layer and is connected with the second gate layer of the second stair step. In some examples, the first sidewall isolation structure and the contact isolation layer are of different material properties. For example, the first sidewall isolation structure is formed of atomic layer deposition (ALD) silicon dioxide, and the contact isolation layer is formed of high density plasma silicon dioxide.

In some embodiments, the semiconductor device includes a second sidewall isolation structure on a sidewall of multiple gate layers and insulating layers in the memory stack. A width of the first sidewall isolation structure and the second sidewall isolation structure can be in a range of 1 nm to 500 nm. In an example, a silicon nitride material is laid on the second sidewall isolation structure.

In some examples, the first landing pad includes an isotropic recess. In some examples, the first landing pad includes a recess with a curved sidewall and/or a beveled sidewall.

Aspects of the disclosure also provide a method for fabricating a semiconductor device. The method includes forming a memory stack of gate layers and insulating layers into stair steps in a staircase region. The gate layers and the insulating layers are stacked alternatingly. Then, the method includes forming a first landing pad on a first gate layer of a first stair step. The first gate layer is a top gate layer on the first stair step. Further, the method includes forming a first sidewall isolation structure on a riser sidewall of a second gate layer of a second stair step. The second gate layer is a top gate layer of the second stair step and being stacked on the first gate layer in the memory stack. The first sidewall isolation structure isolates the second gate layer from the first landing pad.

To form the first sidewall isolation structure on the riser sidewall of the second gate layer, in some embodiments, the method includes forming the stair steps in an initial memory stack for the memory stack. The initial memory stack includes sacrificial layers corresponding to the gate layers. The sacrificial layers include a first sacrificial layer corresponding to the first gate layer, and a second sacrificial layer corresponding to the second gate layer. Then, the method includes forming the first sidewall isolation structure on a riser sidewall of the second sacrificial layer that corresponds to the riser sidewall of the second gate layer.

To form the first sidewall isolation structure on the riser sidewall of the second sacrificial layer, in some examples, the method includes depositing an isolation film that conforms to the stair steps in the initial memory stack. A portion of the isolation film is deposited on the riser sidewall of the second sacrificial layer. Then, the method includes etching the isolation film in a direction. The etching of the isolation film exposes the second sacrificial layer of the second stair step and the first sacrificial layer of the first stair step and leaves the portion of the isolation film on the riser sidewall of the second stair step to be the first sidewall isolation structure.

To deposit the isolation film, in some examples, the method includes depositing a silicon dioxide film using atomic layer deposition (ALD).

In some embodiments, to form the first landing pad on the first gate layer, the method includes depositing a topside sacrificial layer that covers the first sacrificial layer of the first stair step, the second sacrificial layer of the second stair step and the first sidewall isolation structure, and patterning the topside sacrificial layer. The patterning of the topside sacrificial layer exposes the first sidewall isolation structure and divides the topside sacrificial layer into initial landing pads. Further, the method includes forming a contact isolation layer in the staircase region, and replacing the sacrificial layers and the topside sacrificial layer with a material for the gate layers. In some examples, the method also includes etching a first contact hole in the contact isolation layer with a stop based on the first landing pad and forming a first contact structure in the first contact hole.

To pattern the topside sacrificial layer, in some embodiments, the method includes depositing a carbon based mask layer. A portion of the carbon based mask layer is disposed on a transitional portion of the topside sacrificial layer from the first stair step to the second stair step. The transitional portion of the topside sacrificial layer covers the first sidewall isolation structure. Then, the method includes removing the portion of the carbon based mask layer on the transitional portion of the topside sacrificial layer from the first stair step to the second stair step, and etching the transitional portion of the topside sacrificial layer from the first stair step to the second stair step to expose the first sidewall isolation structure.

To etch the transitional portion of the topside sacrificial layer from the first stair step to the second stair step, in some examples, the method includes using a bevel etch process and/or a wet etch process.

To form the contact isolation layer in the staircase region, in an example, the method includes depositing silicon dioxide as the contact isolation layer using high density plasma (HDP) deposition process.

Aspects of the disclosure also provide a memory system device. The memory system device includes a controller coupled to a semiconductor device to control data storage operations on the semiconductor device. The semiconductor device includes a memory stack of gate layers and insulating layers. The gate layers and the insulating layers are stacked alternatingly and are formed into stair steps in a staircase region. The semiconductor device includes a first landing pad on a first gate layer of a first stair step. The first gate layer is a top gate layer of the first stair step. The semiconductor device further includes a first sidewall isolation structure on a riser sidewall of a second gate layer of a second stair step. The second gate layer is a top gate layer of the second stair step and is stacked on the first gate layer in the memory stack. The first sidewall isolation structure isolates the second gate layer from the first landing pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
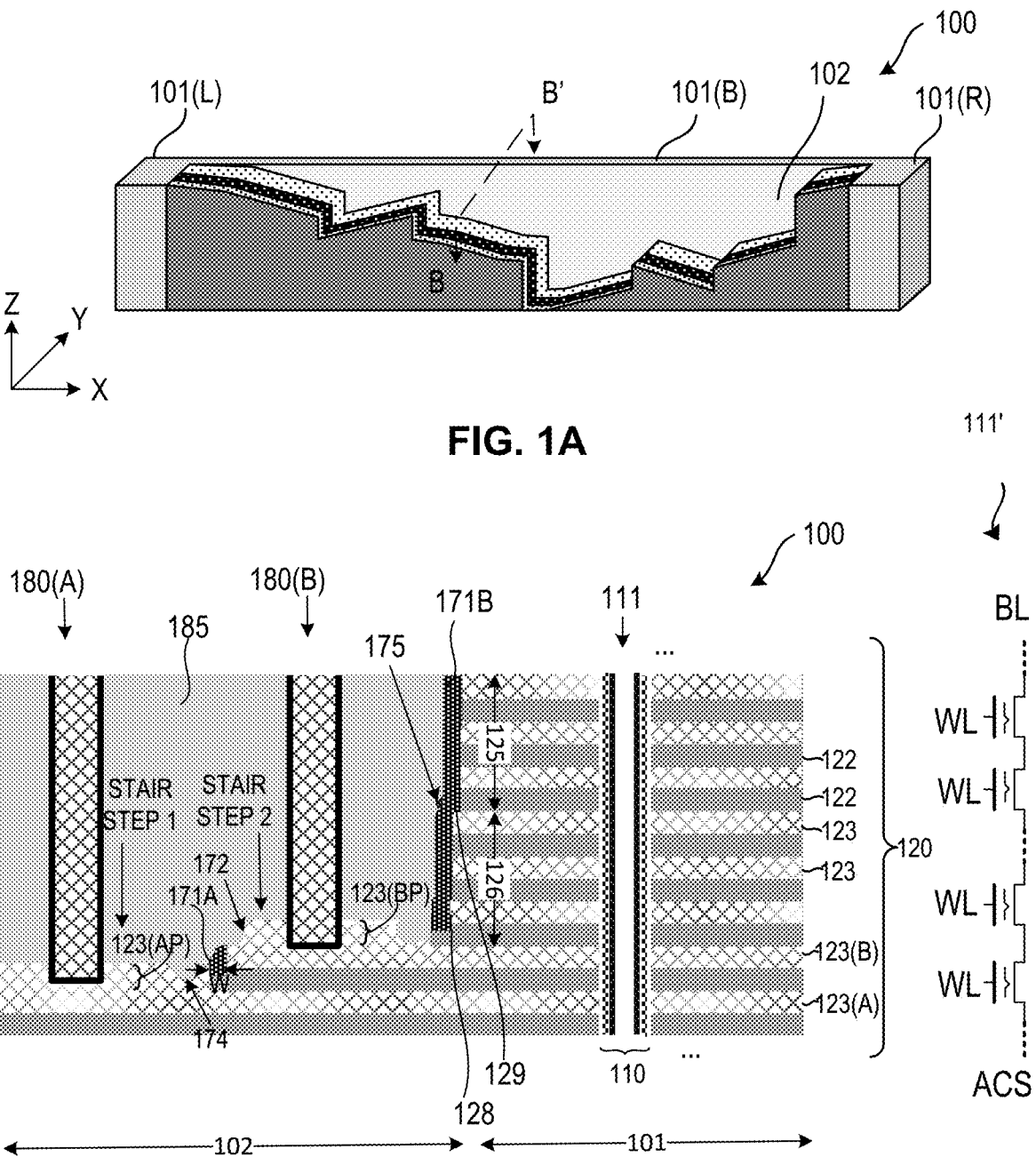
FIGS. 1A-1B show a perspective view and a cross-sectional view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three dimensional (3D) NAND flash memory device includes vertical memory cell strings formed in a memory stack of gate layers and insulating layers. The gate layers and the insulating layers are stacked alternatingly. The gate layers can correspond to gate terminals of transistors in the vertical memory cell strings. The 3D NAND flash memory device can include a staircase region to facilitate connections to the gate layers. The staircase region includes stair steps, each stair step includes a top gate layer that is one of the gate layers and each gate layer can be a top gate layer of a stair step. In some examples, contact holes are etched through a contact isolation layer to expose respective top gate layers on respective stair steps in the staircase region. Then, contact structures can be formed in the contact holes to connect respective top gate layers of the stair steps to, for example word lines of the 3D NANAD flash memory device.

According to some aspects of the disclosure, to prevent the etch process for forming the contact holes from etching through (also referred to as punch through) a top gate layer of a stair step (the punch through can cause short circuits), thickness of the top gate layer in the stair step can be increased. The thickness increase of the top gate layers in the staircase region can be performed by a use of a topside sacrificial layer technique in a gate last technology.

In the gate last technology, an initial memory stack of sacrificial layers and insulating layers are formed, and the sacrificial layers and the insulating layers are stacked alternatingly in the initial memory stack. After channel structures are formed in the initial memory stack in an array region and stair steps are formed based on the initial memory stack in the staircase region, the sacrificial layers can be replaced with gate layers to form the memory stack. In some examples, the sacrificial layers are made of silicon nitride, and the insulating layers are made of silicon dioxide.

In some examples, to use the topside sacrificial layer technique, after the formation of the stair steps in initial memory stack in the staircase region, the sacrificial layers can be exposed on the stair steps. Then, a topside sacrificial layer (e.g., an additional silicon nitride layer) can be formed over the stair steps. The topside sacrificial layer can increase the thickness of the sacrificial layers on the stair steps. The topside sacrificial layer can be patterned to form initial landing pads respectively on the stair steps, and the initial landing pads are isolated from each other. In the process that replaces the sacrificial layers with the gate layers, the initial landing pads can be replaced by material(s) that forms the gate layers to form real landing pads on the stair steps.

In some related examples, the patterning of the topside sacrificial layer relies on a sidewall profile in the staircase region to ensure isolation of the landing pads. In a related example, a thicker top sacrificial layer can cause a gentle slope over a stair riser portion compared to a thinner top sacrificial layer that can cause a steep slope over a stair riser portion. The gentle slope may cause residues of the topside sacrificial layer between adjacent stair steps during the patterning process, the residues may be in touch with the sacrificial layers in the memory stack. During the replacement process to replace the sacrificial layers with the gate layers, the residues can be replaced by the material of the gate layers, and thus can cause leakage or even shorts between word lines. In another related example, a staircase region may include a sidewall of multiple gate layers and insulating layers (also referred to as a great wall in some examples) in the memory stack. When the profile of the sidewall is not steep enough, for example, a portion of the sidewall having a sub shoulder, the patterning process may leave residues at the sub shoulder. When the residues are replaced by the material of the gate layers, the residues can cause leakage or even shorts between word lines.

Some aspects of the disclosure provide techniques to avoid leakage or shorts between word lines. For example, sidewall isolation structures can be formed along sidewalls (e.g., a riser portion of a stair step, a sidewall of a great wall in the memory stack) in the staircase region. According to an aspect of the disclosure, the sidewall isolation structures can isolate residues of the topside sacrificial layer from the sacrificial layers that are later replaced with the gate layers to prevent the residues being replaced by the gate layer material, and thus can avoid current leakage between the word lines. According to another aspect of the disclosure, the use of the sidewall isolation structures can enable a usage of wet etch process during the patterning of the top sacrificial layer to ensure insulation between sacrificial layers that are later replaced with gate layers (corresponding to word lines), and avoid word line to word line leakage.

The techniques provided in the disclosure can reduce profile requirements of sidewalls in the staircase region, and improve process window for forming stairs in the staircase region. Further, the techniques provided in the disclosure allow thicker topside sacrificial layer and can improve the process window for contact hole etching process.

FIG. 1A shows a perspective view of a semiconductor device 100, and FIG. 1B shows a cross sectional view of the semiconductor device 100 along a B-B' line shown in FIG. 1A according to some embodiments of the disclosure. The semiconductor device 100 includes a memory stack 120 formed in an array region 101 (e.g., 101(L), 101(B) and 101(R)) and a staircase region 102. In the array region, the semiconductor device 100 includes vertical memory cell strings 111 formed in the memory stack 120; and in the staircase region 102, the semiconductor device 100 includes contact structures 180 (e.g., 180(A), 180(B)) that can provide word line driving signals to gate terminals of transistors in the vertical memory cell strings 111. Further, the semiconductor device 100 includes sidewall isolation structures 171 (e.g., 171A and 171B) on sidewalls of the memory stack 120 in the staircase region 102. The sidewall isolation structures 171 can be used to avoid leakage between word lines, and improve process windows for contact structures.

It is noted that the semiconductor device 100 can be any suitable device, for example, memory circuits, a semiconductor die with memory circuits formed on the semiconductor die, a semiconductor wafer with multiple semiconductor dies formed on the semiconductor wafer, a semiconductor chip with a stack of semiconductor dies bonded together, a semiconductor package that includes one or more semiconductor dies or chips assembled on a package substrate, and the like.

It is also noted that, the semiconductor device 100 can include other suitable circuitry (not shown), such as logic circuitry, power circuitry, and the like that is formed on the same substrate, or other suitable substrate, and is suitably coupled with the memory cell arrays.

Generally, the semiconductor device 100 is fabricated based on a substrate, such as a silicon (Si) substrate, a germanium (Ge) substrate, a silicon-germanium (SiGe) substrate, and/or a silicon-on-insulator (SOI) substrate. In some examples, the substrate can be in the final product of the semiconductor device 100. In some other examples, the substrate can be removed during fabrication processing and thus the substrate is not in the final product of the semiconductor device 100. For simplicity, the main surface of the substrate is referred to as an X-Y plane, and the direction perpendicular to the main surface is referred to as Z direction.

In the array region 101, vertical memory cell strings 111 are formed based on channel structures 110 in the memory stack 120. In the FIG. 1B example, a vertical memory cell string 111 is shown as representation of an array of vertical memory cell strings 111 formed in the array region 101. FIG. 1B also shows a schematic symbol version of a vertical memory cell string 111' corresponding to the vertical memory cell string 111. The vertical memory cell strings 111 are formed in the memory stack 120 of layers. The memory stack 120 includes gate layers 123 (e.g., 123, 123(A), 123(B)) and insulating layers 122 that are stacked alternatingly. The gate layers 123 are made of gate stack materials, such as high dielectric constant (high-k) gate insulator layers, metal gate (MG) electrode, and the like. The insulating layers 122 are made of insulating material(s), such as silicon nitride, silicon dioxide, and the like. In some examples, the gate layers 123 are formed of tungsten, and the insulating layers 122 are formed of silicon dioxide.

It is noted that FIG. 1B shows a portion of the memory stack 120, the memory stack 120 can include additional gate layers and insulating layers above the portion shown in FIG. 1B, and can include additional gate layers and insulating layers below the portion shown in FIG. 1B.

In the array region 101, channel structures 110 are formed in the memory stack 120. The memory stack 120 and the channel structures 110 are configured to form transistors that are stacked vertically. In some examples, a stack of transistors includes memory cells and select transistors, such as one or more bottom select transistors, one or more top select transistors and the like. In some examples, the stack of transistors can include one or more dummy select transistors. The gate terminals of the transistors in the vertical memory cell string 111 are connected to word line (WL) driving circuits, and the gate layers 123 can correspond to word lines. In some examples, one end of the stack of transistors is connected to a bit line (BL), and another end of the stack of transistors is connected to an array common source (ACS).

As shown in the FIG. 1A, the staircase region 102 can be disposed at a center of the array region 101. For example, the array region 101 includes a left portion 101(L), a right portion 101(R) and bridge portion(s) 101(B). The left portion 101(L) and the right portion 101(R) are interconnected by the bridge portion(s) 101(B). In some examples, the staircase region 102 is surrounded by the left portion 101(L), the right portion 101(R), and the bridge portion(s) 101(B). It is noted that the present disclosure is not limited to the placement of the staircase region and array region.

In the staircase region 102, stair steps are formed in the memory stack 120, each stair step includes a top gate layer from the gate layers 123 associated with the stair step. For example, the gate layer 123(A) is the top gate layer of the stair step 1, and the gate layer 123(B) is the top gate layer of the stair step 2. The contact structures 180 (e.g., 180(A), 180(B)) are formed to conductively connect respective top gate layers on the stair steps to routing wires (not shown) that are connected to word line driving circuitry. The contact structures 180 are formed of suitable conductive materials, such as titanium (Ti), titanium nitride (TiN), tungsten and the like.

According to an aspect of the disclosure, landing pads are formed on the stair steps to increase thickness of the top gate layers of the stair steps in order to avoid being punched through during a contact hole etch process. The landing pads can be formed of the same material as the gate layers in some examples. Specifically, the gate layer 123(A) is the top gate layer of the stair step 1, and a landing pad 123(AP) is formed on the gate layer 123(A) at the stair step 1. Similarly, the gate layer 123(B) is the top gate layer of the stair step 2, and a landing pad 123(BP) is formed on the gate layer 123(B) at the stair step 2.

According to some aspects of the disclosure, the staircase region 102 may include walls for multiple gate layers 123 and insulating layers 122. A wall of multiple gate layers 123 and insulating layers 122 can be referred to as a great wall. For example, FIG. 1B shows a great wall 128 of multiple gate layers 123 and insulating layers 122 at the boundary of the array region 101 and the staircase region 102. In some examples, the great wall 128 is a result of a chop process and other processing techniques to form stair steps in the staircase region 102. The chop process can remove (e.g., etch) multiple gate layers 123 and insulating layers 122 in selected regions. In some examples, a great wall can be a result of multiple rounds of chop process. For example, the great wall 128 at the boundary of the array region 101 and the staircase region 102 is a result of a first round of the chop process that removes a first portion 125 of gate layers 123 and insulating layers 122 in the staircase region 102 and a second round of the chop process that removes a second portion 126 of gate layers 123 and insulating layers 122 in the staircase region 102. Due to process variations (e.g., alignment variation, etch variation, and the like), the great wall 128 has a portion 129 of a shoulder shape at an interface of the first portion 125 and the second portion 126, and the portion 129 is referred to as a sub-shoulder 129.

According to some aspects of the disclosure, the semiconductor device 100 includes the sidewall isolation structures 171 (e.g., 171A and 171B) on sidewalls of the memory stack 120 in the staircase region 102. In the FIG. 1B example, the sidewall isolation structure 171A is disposed on a riser sidewall of the stair step 2 (also referred to as a riser sidewall of the gate layer 123(B)) in the staircase region 102. Specifically, the sidewall isolation structure 171A is bottomed on the insulating layer 122 that is between the gate layer 123(A) and the gate layer 123(B), and is immediately adjacent to the sidewall of the gate layer 123(B) at the riser portion from the stair step 1 to the stair step 2. The sidewall isolation structure 171A isolates the landing pad 123(AP) of the stair step 1 from the top gate layer 123(B) of the stair step 2.

In some embodiments, the sidewall isolation structure 171(A) is formed of silicon dioxide based on atomic layer deposition (ALD) on the sidewall of the gate layer 123(B), thus the width (shown by W) of the sidewall isolation structure 171(A) is about the same as the deposition thickness, and is in a range of 1 nm to 500 nm. Further, the sidewall isolation structure 171(A) is formed based on the gate layer 123(B) before the formation of the landing pad 123(BP). The sidewall isolation structure 171(A) does not extend to the sidewall of the landing pad 123(BP). The sidewall of the landing pad 123(BP) is covered by a different isolation layer, such as a contact isolation layer 185. In some examples, the sidewall isolation structure 171(A) and the contact isolation layer 185 are of a same material, but are formed by different process, and may have different material properties. For example, the sidewall isolation structure 171(A) is formed of silicon dioxide that is deposited using atomic layer deposition (ALD); and the contact isolation layer 185 is formed of silicon dioxide that is deposited using high density plasma (HDP) based deposition. The sidewall isolation structure 171(A) and the contact isolation layer 185 may have different etch rates.

In some embodiments, the sidewall isolation structure 171(A) allows usage of wet etch process in patterning the (initial) landing pads, such as initial landing pads of sacrificial material for the landing pad 123(AP) and the landing pad 123(BP). In some examples, the wet etch process can generate isotropic recesses in the landing pad 123(AP) and/or the landing pad 123(BP), shown by recess 172 and recess 174. In some examples, the wet etch process can generate recesses with curved sidewall or beveled sidewall or undercuts, shown by the recess 172 and the recess 174.

In the FIG. 1B example, the sidewall isolation structure 171B is disposed immediately adjacent to the great wall 128 between the staircase region 102 and the array region 101. The sidewall isolation structure 171B can isolate the gate layers 123 from residues (e.g., residues in a patterning process for initial landing pads). In an example, due to the sub shoulder 129, a material (e.g. a residual material, such as a residue 175) is not completely removed by, for example the wet etch process in patterning the initial landing pads. The sidewall isolation structure 171B can isolate the residue 175 from the gate layers 123. In an example, the residue 175 is of the same material as a sacrificial layer (e.g., silicon nitride). The sidewall isolation structure 171B can prevent the residue 175 to be replaced by the material for the gate layers 123, and thus can avoid current leakage between the gate layers (corresponding to word lines of transistors in the vertical memory cell string).

Figure 2:
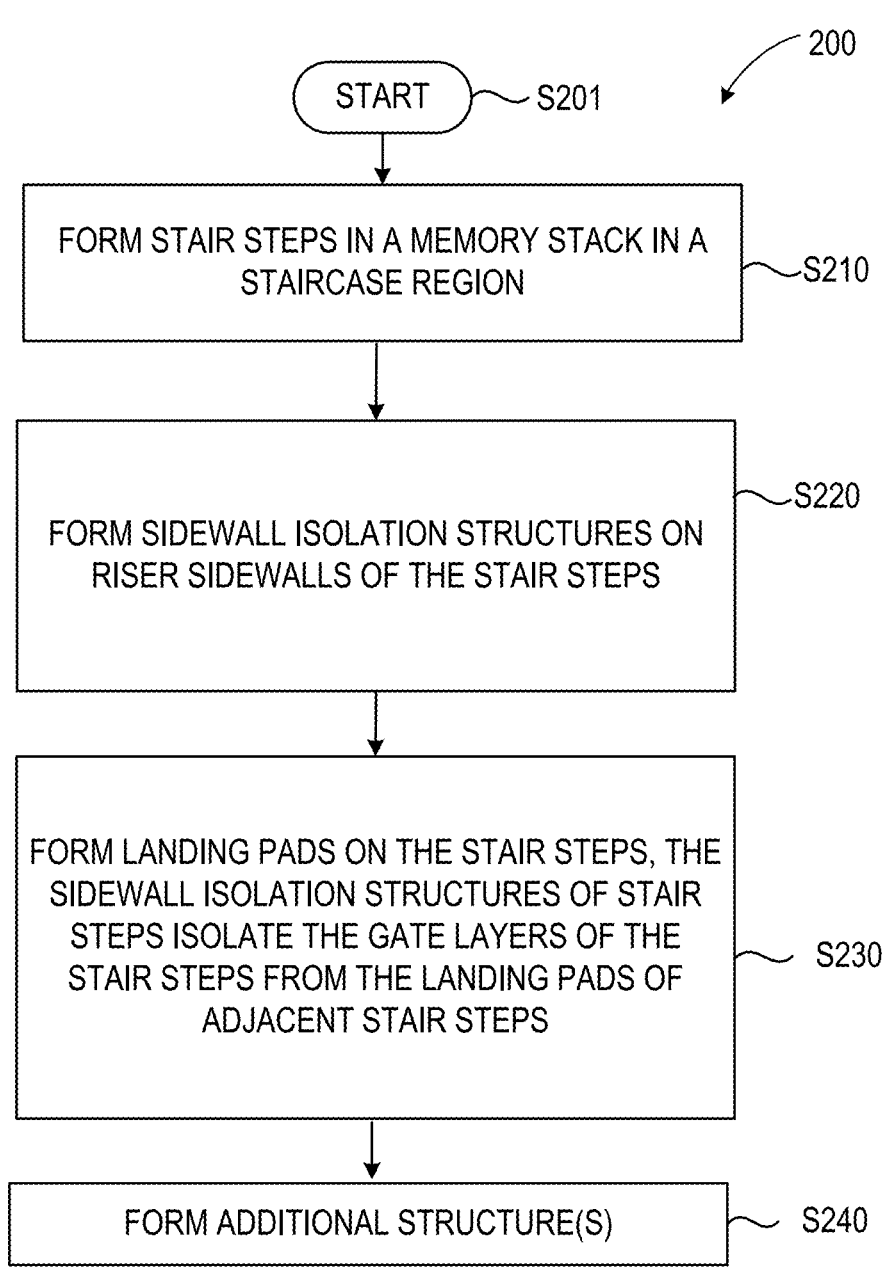
FIG. 2 shows a flow chart outlining a process example for fabricating a semiconductor device according to some embodiments of the disclosure.

FIG. 2 shows a flow chart outlining a process 200 for fabricating a semiconductor device, such as the semiconductor device 100, according to some embodiments of the disclosure.

At S210, stair steps are formed in a memory stack in a staircase region. The memory stack includes gate layers and insulating layers stacked alternatingly. In some examples, the stair steps are formed in an initial memory stack. The initial memory stack includes sacrificial layers and the insulating layers stacked alternatingly. After channel structures are formed in an array region of the initial memory stack, and the stair steps are formed in a staircase region of the initial memory stack, the sacrificial layers can be replaced by the gate layers.

At S220, sidewall isolation structures are formed on sidewalls of the stair steps. In some examples, after the stair steps are formed in the initial memory stack for the memory stack, the sidewall isolation structures can be formed on riser sidewall of the stair steps and sidewall of great walls. For example, the sidewall isolation structure 171A is formed on a riser sidewall of a sacrificial layer corresponding to (later replaced by) the gate layer 123(B). In another example, the sidewall isolation structure 171B is formed on a sidewall of a great wall in the initial memory stack.

In some examples, to form the sidewall isolation structures, an isolation film is deposited with good step coverage. For example, the isolation film conforms to the stair steps in the initial memory stack. Thus, a portion of the isolation film is deposited on the sidewalls of the stair steps. In an example, the isolation film is a silicon dioxide film deposited using atomic layer deposition (ALD). Then, the isolation film is etched in a direction, such as in a direction perpendicular to the wafer surface. The etching of the isolation film can expose the top sacrificial layers of stair steps and leave the portion of the isolation film on the sidewalls of the stair steps. The remaining isolation film on the sidewalls of the stair steps can form the sidewall isolation structures.

At S230, landing pads are formed on the stair steps. The sidewall isolation structures of the stair steps can isolate the gate layers of the stair steps from the landing pads of adjacent stair steps. In some examples, the landing pads are formed based on initial landing pads in a topside sacrificial layer.

In an example, a topside sacrificial layer (an additional sacrificial layer) is deposited on the stair steps. The topside sacrificial layer can cover the sacrificial layers of the stair steps and the sidewall isolation structures. Then, the topside sacrificial layer is patterned into initial landing pads. For example, the patterning of the topside sacrificial layer can expose the sidewall isolation structures that divide the top sacrificial layer into the initial landing pads. The initial landing pads can be replaced by a material for the gate layers to form the landing pads at the same time when the sacrificial layers are replaced by the material for the gate layers.

In some examples, to pattern the topside sacrificial layer, a carbon based mask layer is used. For example, when a carbon based mask layer is deposited, a portion of the carbon based mask layer is disposed on transitional portions (between adjacent stair steps) of the topside sacrificial layer that cover the sidewall isolation structures. Then, the portion of the carbon based mask layer on the transitional portions of the topside sacrificial layer is removed to expose the transitional portions of the topside sacrificial layer that cover the sidewall isolation structures. Further, the transitional portions of the topside sacrificial layer covering the sidewall isolation structures are removed to expose the sidewall isolation structures. The sidewall isolation structures divide the topside sacrificial layer into the initial landing pads. In some examples, the transitional portions of the topside sacrificial layer can be removed using a wet etch process and/or a bevel etch process.

At S240, additional structures may be formed. In some examples, a contact isolation layer (e.g., silicon dioxide) can be deposited, for example, using high density plasma (HDP) deposition. Then, contact holes can be formed in the contact isolation layer with a stop based on the landing pads. Further, contact structures can be formed in the contact holes.

It is noted that the process 200 can be suitably adapted. Step(s) in the process 200 can be modified and/or omitted. Additional step(s) can be added. Any suitable order of implementation can be used.

FIGS. 3A-3L show cross-sectional views of a semiconductor device, such as the semiconductor device 100, at various intermediate steps of wafer level manufacturing, in accordance with some embodiments of the present disclosure.

Figure 3A:
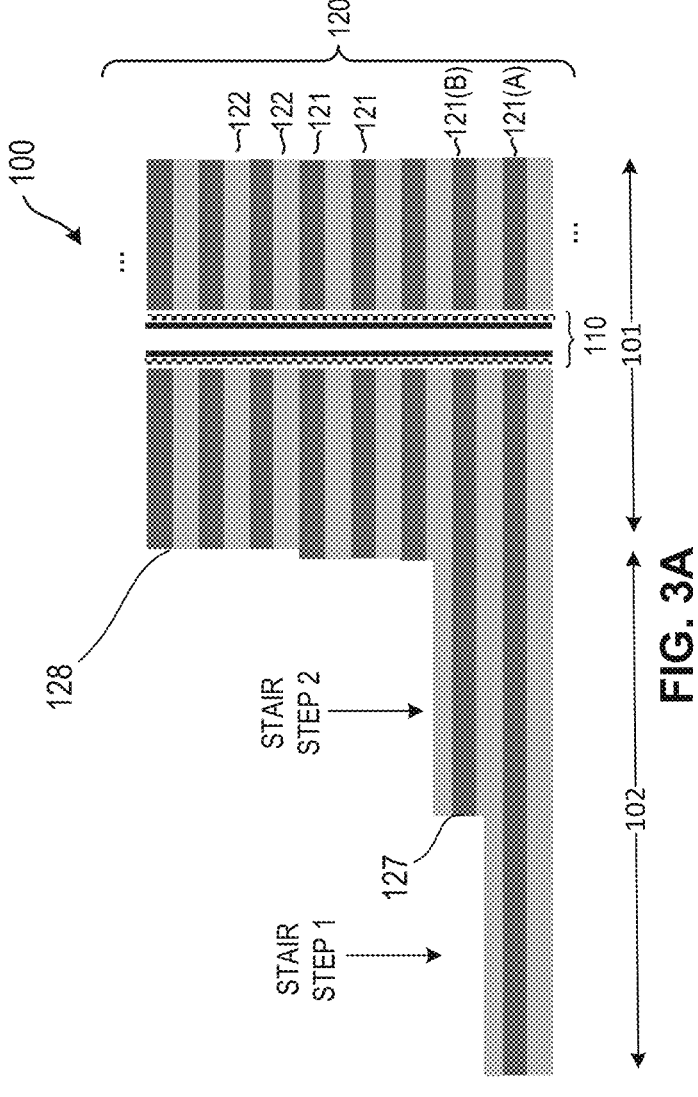
FIGS. 3A-3L show cross-sectional views of a semiconductor device at various intermediate steps of manufacturing in accordance with some embodiments of the disclosure.

FIG. 3A shows a cross-sectional view of the semiconductor device 100 after stair steps are formed in the staircase region 102. In an example, an initial memory stack 120' of layers is deposited on a substrate (not shown). In the FIG. 3A example, the initial memory stack 120' includes sacrificial layers 121 (e.g., 121, 121(A), 121(B)) and insulating layers 122 that are stacked alternatingly. In an example, the sacrificial layers 121 are made of silicon nitride, and the insulating layers 122 are made of silicon dioxide. Further, channel structures 110 are formed in the initial memory stack 120' in an array region 101, and stair steps, such as stair step 1 and stair step 2 in FIG. 3A, are formed in the initial memory stack 120' in a staircase region 102. In some example, the process to form a stair step can stop in an insulating layer 122 on a top sacrificial layer 121 associated with the stair step. For example, the process to form the stair step 1 stops on an insulating layer 122 above the sacrificial layer 121(A); the process to form the stair step 2 stops on an insulating layer 122 above the sacrificial layer 121(B).

Due to the formation of the stair steps, the staircase region 102 includes sidewalls of sacrificial layer(s) and insulating layer(s). For example, the staircase region 102 includes a riser sidewall 127 that is transitional portion from the stair step 1 to the stair step 2. The staircase region 102 also includes a great wall 128 that is between the staircase region 102 and the array region 101.

Figure 3B:
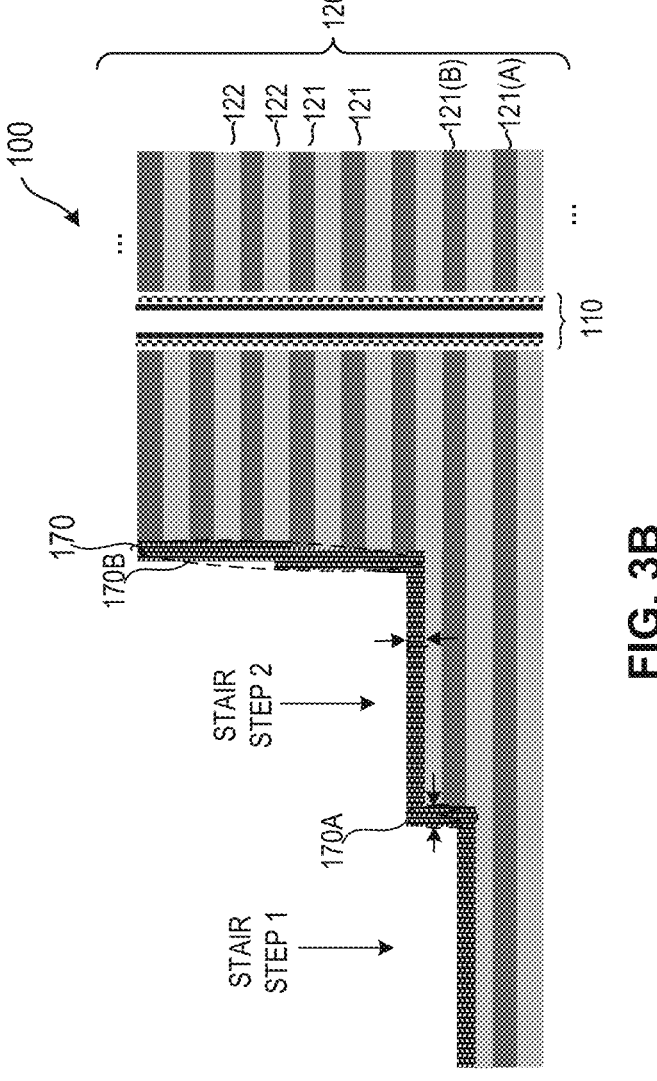

FIG. 3B shows a cross-sectional view of the semiconductor device 100 after an isolation film 170 is deposited. In an example, the isolation film 170 with good step coverage is deposited. For example, the isolation film 170 conforms to the stair steps in the initial memory stack 120'. In an example, the isolation film 170 is a silicon dioxide film deposited using atomic layer deposition (ALD). Thus, a portion of the isolation film 170 is deposited on the sidewalls, such as riser sidewalls of the stair steps (e.g., 170A), a great wall of multiple sacrificial layers and insulating layers (e.g., 170B). In some examples, a width (W) of the isolation film 170 on the sidewalls is about the same as a thickness (T) of the isolation film 170, and is in a range of 1 nm to 500 nm.

Figure 3C:
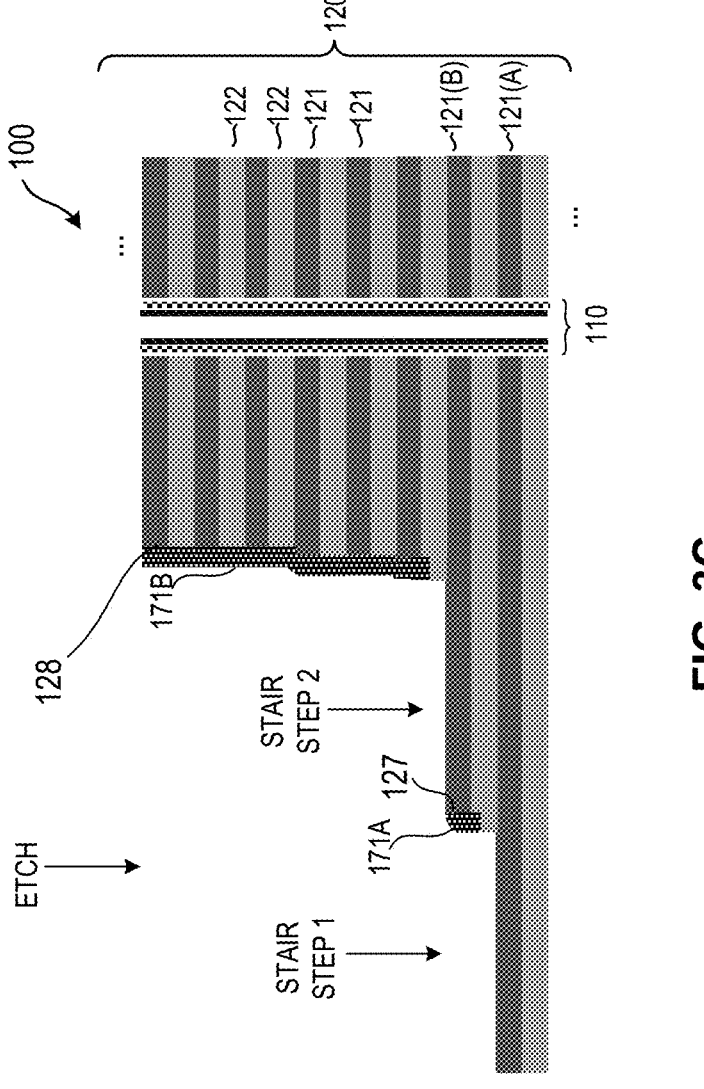

FIG. 3C shows a cross-sectional view of the semiconductor device 100 after sidewall isolation structures are formed. In an example, a blank etch (etch without mask) is performed. For example, a dry etch of silicon dioxide is perform that removes silicon dioxide in a direction (e.g., a vertical direction to wafer substrate as shown). The blank etch removes the isolation film 170 and the insulating layer 122 on the sacrificial layer 121(A) of the stair step 1, thus exposes the sacrificial layer 121(A) on the stair step 1. The blank etch also removes the isolation film 170 and an insulating layer 122 on the sacrificial layer 121(B) of the stair step 2, and exposes the sacrificial layer 121(B) on the stair step 2. The blank etch can leave the portion of the isolation film 170 on the riser sidewalls of the stair steps and sidewall of the great walls. In the FIG. 3C example, the remaining isolation film on the riser sidewall 127 of the stair step 2 forms the sidewall isolation structure 171A, the remaining isolation film on the sidewall of the great wall 128 can form the sidewall isolation structure 171B.

Figure 3D:
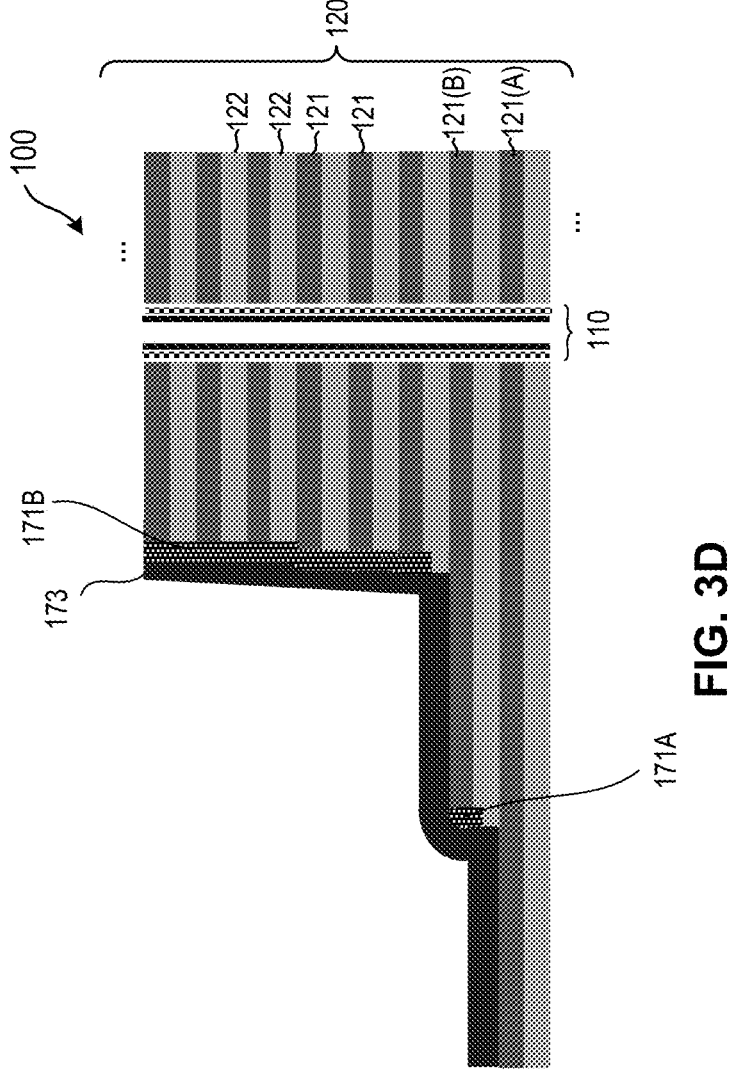

FIG. 3D shows a cross-sectional view of the semiconductor device 100 after a topside sacrificial layer 173 is deposited. In some examples, the topside sacrificial layer 173 is formed of a same material as the sacrificial layers 121, such as silicon nitride.

FIGS. 3E-3I illustrate patterning of the topside sacrificial layer 173 to divide the topside sacrificial layer 173 into initial landing pads. The patterning of the topside sacrificial layer 173 is based on a carbon based mask layer.

Figure 3E:
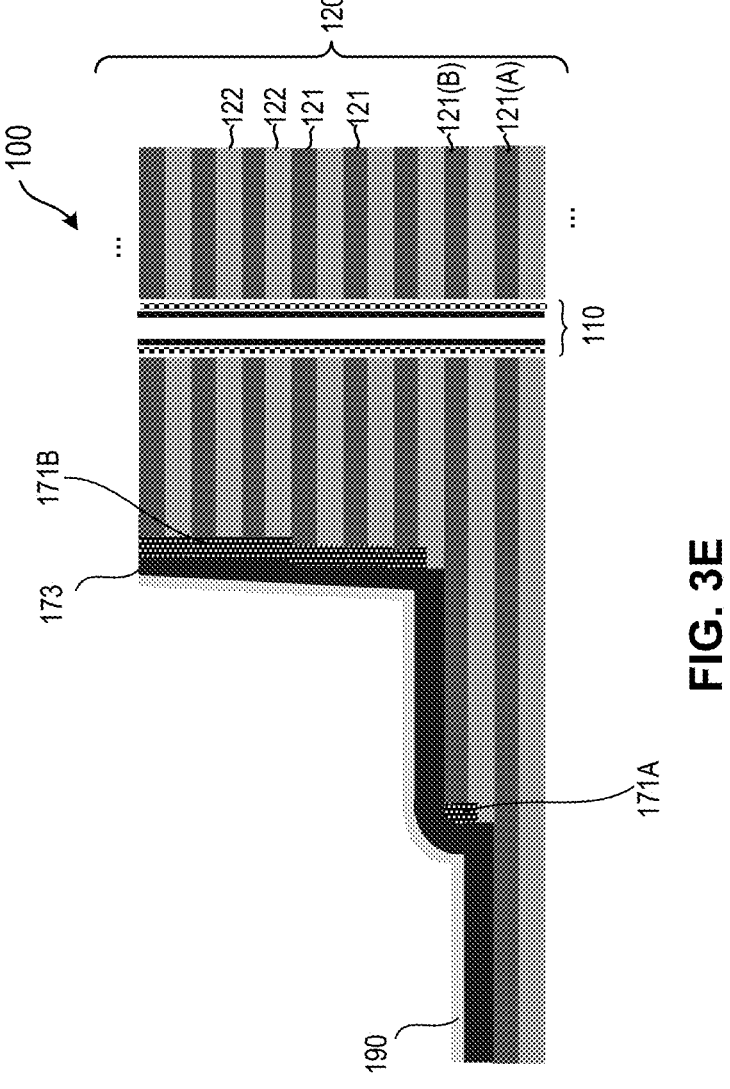

FIG. 3E shows a cross-sectional view of the semiconductor device 100 after a carbon based mask layer 190 is deposited. In some examples, the carbon based mask layer 190 is amorphous carbon that is deposited using chemical vapor deposition, and is is relatively loose.

Figure 3F:
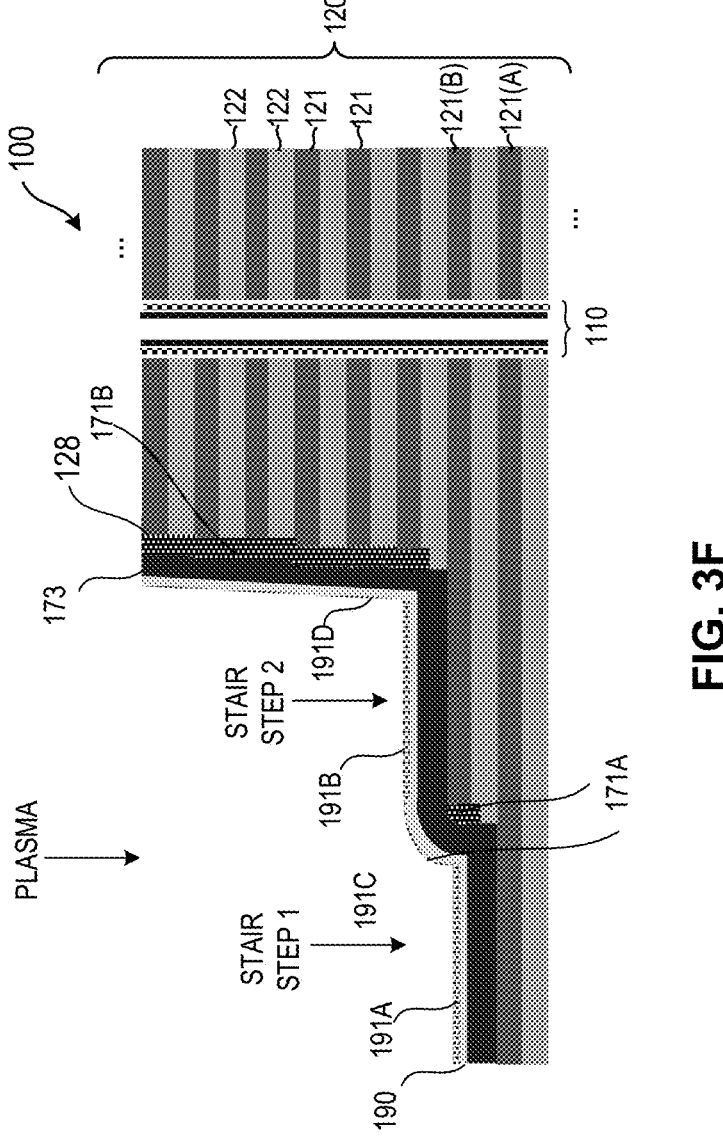

FIG. 3F shows a cross-sectional view of the semiconductor device 100 after a plasma process is performed. In some examples, the plasma process can bias argon ions in a direction, such as a vertical direction to the wafer surface, to bombard the carbon based mask layer 190. The plasma processed surface of the carbon based mask layer 190 can become relatively solid (e.g., higher density than the amorphous carbon). Due to the directional plasma processing, surface perpendicular to the argon ion direction can have thicker solid carbon than surface inclined to the argon ion direction. As shown in FIG. 3F, the surface of the carbon based mask layer 190 on the stair step 1 and stair step 2 can have relatively thicker solid carbon, as shown by 191A and 191B. The surface of the carbon based mask layer 190 transitional from the stair step 1 to the stair step 2 can have relatively thinner solid carbon, as shown by 191C; the surface of the carbon based mask layer 190 on the sidewall of the great wall 128 can have relatively thinner solid carbon, as shown by 191D.

Figure 3G:
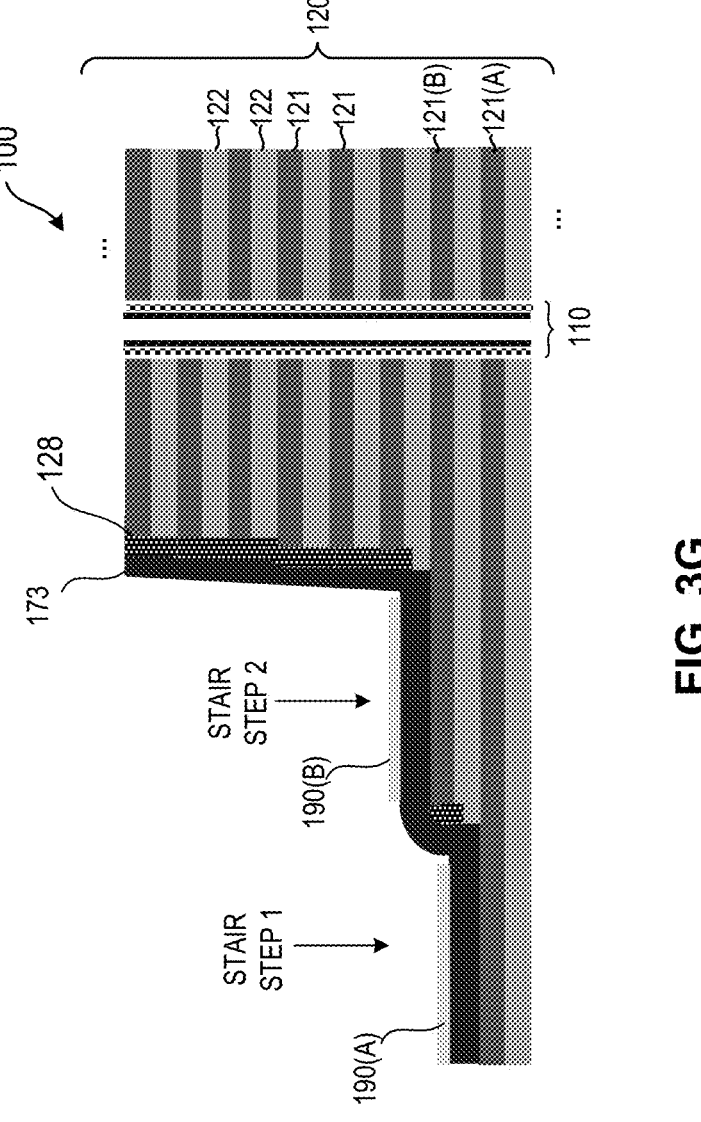

FIG. 3G shows a cross-sectional view of the semiconductor device 100 after a trim process is performed. The trim process provides oxygen with high temperature to remove carbon. It is noted that thicker solid carbon can protect the underneath amorphous carbon from been removed. However, due to thinner solid carbon at 191C and 191D, the amorphous carbon at the place transitional from the stair step 1 to the stair step 2, and on the sidewall of the great wall 128, can be completely removed by the trim process. It is noted that amorphous carbon can remain on the stair step 1 and the stair step 2 after the trim process due to the protection by thicker solid carbon, and patterns can be formed in the carbon based mask layer 190, such as shown by 190(A) and 190(B).

Figure 3H:
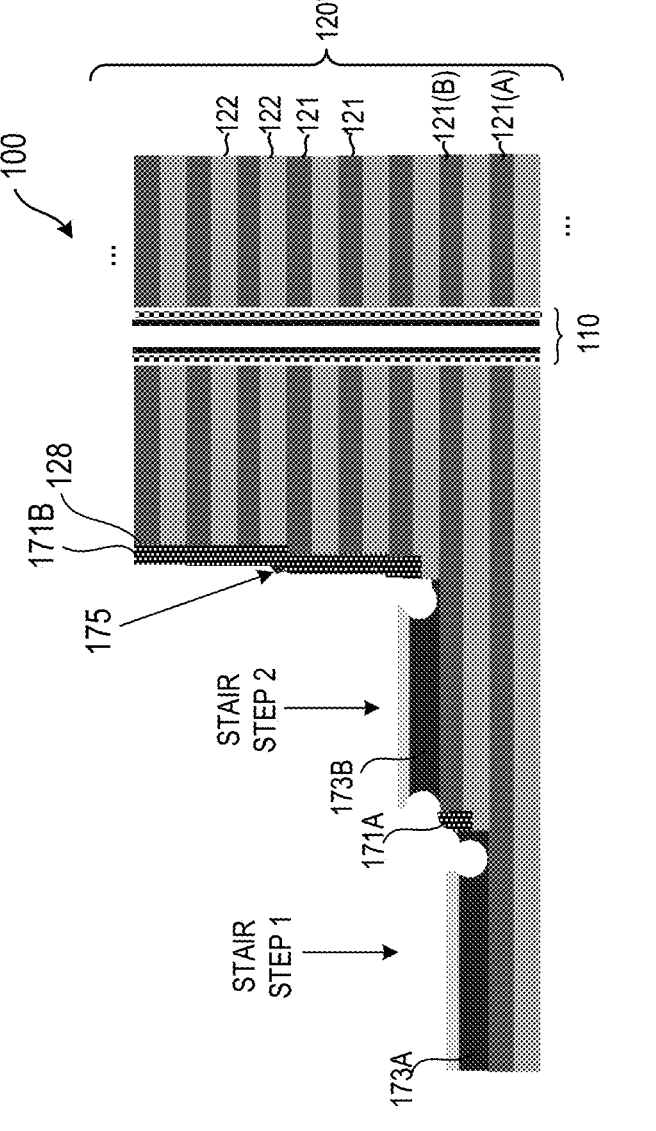

FIG. 3H shows a cross-sectional view of the semiconductor device 100 after an etching of the topside sacrificial layer 173 based on patterns in the carbon based mask layer 190. In some examples, the etching of the topside sacrificial layer 173 is isotropic. In an example, the etching of the topside sacrificial layer 173 is performed using bevel etch process and/or wet etch process. The bevel etch process and/or wet etch process can be controlled to expose the sidewall isolation structures, such as the sidewall isolation structure 171A, the sidewall isolation structure 171B, and the like, thus the topside sacrificial layer 173 is divided into initial landing pads, such as shown by 173A and 173B. It is noted that etching of the topside sacrificial layer 173 may leave residues, such as a residue 175 on a sub-shoulder portion of the sidewall isolation structure 171B. However, the residue 175 is isolated and is not in touch with the sacrificial layers 121.

Figure 3I:
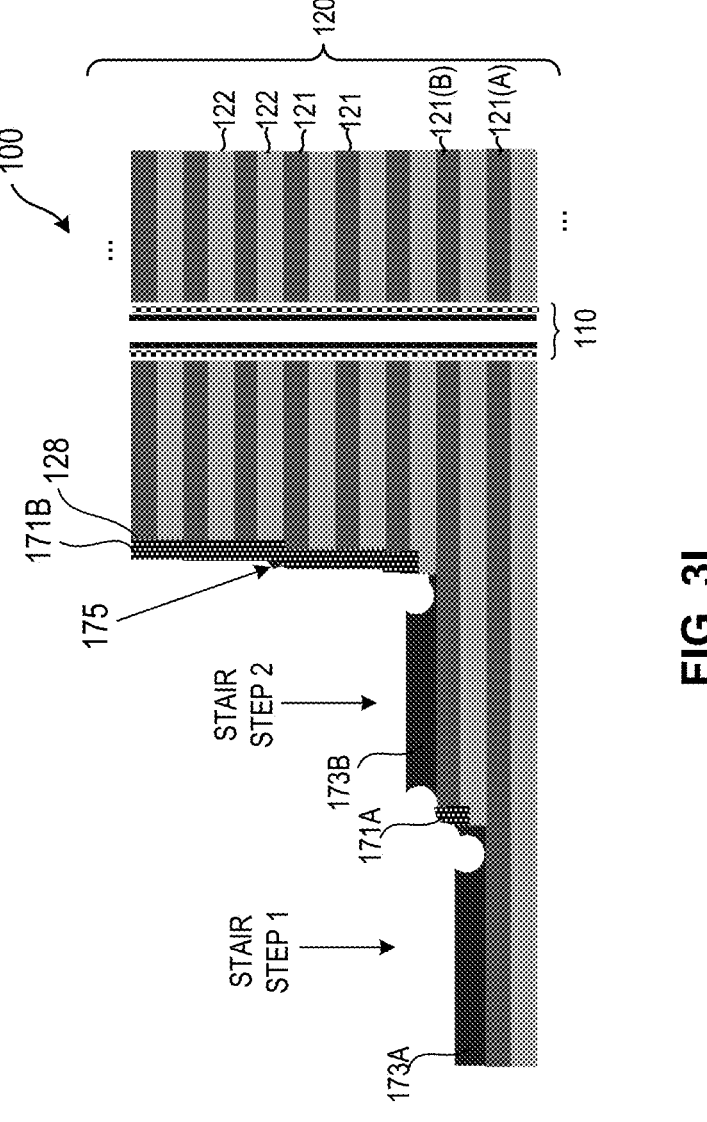

FIG. 3I shows a cross-sectional view of the semiconductor device 100 after the remaining of the carbon based mask layer 190 is removed. In an example, the remaining of the carbon based mask layer 190 can be removed by a process that is referred to as an asher process. The asher process can provide oxygen with high temperature to remove the remaining carbon. The asher process can be followed by a wet cleaning process to remove residues due to the asher process.

Figure 3J:
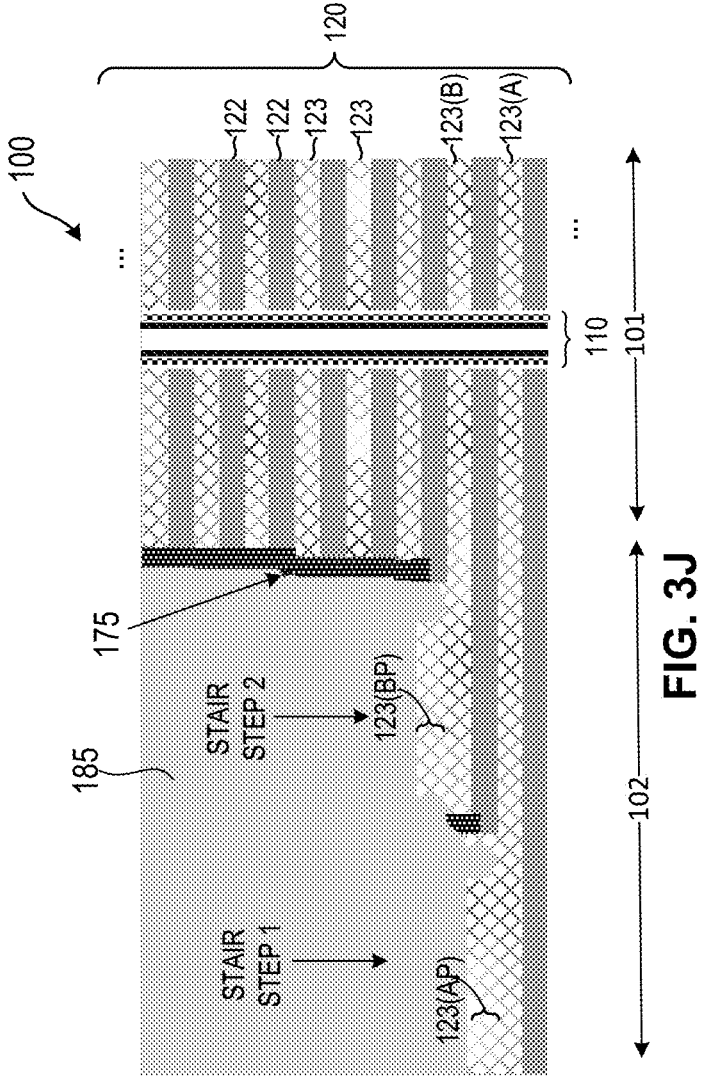

FIG. 3J shows a cross-sectional view of the semiconductor device 100 after a replacement of the sacrificial layers with gate layers to form the real memory stack 120. In some examples, a contact isolation layer 185 is formed in the staircase region 102. In an example, the contact isolation layer 185 is formed of silicon oxide, and can be deposited using high density plasma (HDP) deposition. The contact isolation layer 185 can be suitably planarized, for example, using chemical mechanical polishing (CMP) process. Then, the sacrificial layers, including the sacrificial layers 121 and the topside sacrificial layer 173 can be replaced by material (s) for gate layers. In some examples, trenches (not shown) can be formed in the initial memory stack 120'. Based on the trenches, the sacrificial layers 121 and portions of the topside sacrificial layer 173 that are in touch with the sacrificial layers 121 (e.g., the initial landing pads 173A and 173B) can be removed (e.g., using suitable wet etch process) to leave space for material(s) of gate layers. It is noted that the residue 175 is isolated, and will not be removed. Further, based on the trenches, the material(s) for the gate layers (e.g., tungsten) can be filled into the space. Then, the trenches can be suitably filled.

It is noted that the replacement of the sacrificial layers with gate layers can also replace the initial landing pads 173A and 173B with landing pads 123(AP) and 123(BP). Thus, the top gate layer on the stair step 1 includes the landing pad 123(AP) on the gate layer 123(A), and the top gate layer on the stair step 2 includes the landing pad 123(BP) on the gate layer 123(B).

Figure 3K:
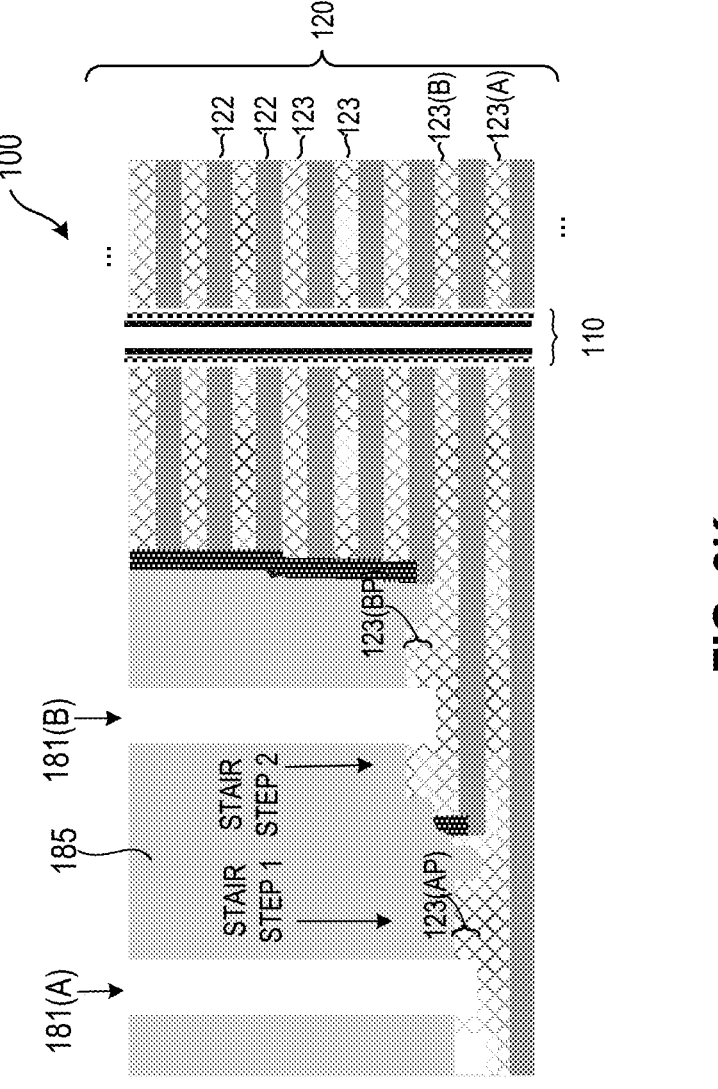

FIG. 3K shows a cross-sectional view of the semiconductor device 100 after contact holes are formed. In some examples, a contact hole etch process to remove silicon oxide can be performed based on a contact mask. The contact hole etch process can be configured with a stop based on the material of the landing pads, such as tungsten. Because of the thickness differences of the contact isolation layer 185 on different stair steps, the contact hole etch process may be configured to over etch in order to make sure that all the contact holes are etched through the contact isolation layer 185. The addition of the landing pads 123 (AP) and 123(BP) on the stair steps can increase process window for the contact hole etch process, and avoid punch through the gate layers, such as the gate layer 123(A), the gate layer 123(B). As shown, a contact hole 181(A) is formed on the stair step 1, and the contact hole 181(A) may be formed with over etching into the landing pad 123(AP). Similarly, a contact hole 181(B) is formed on the stair step 2, and the contact hole 181(B) may be formed with over etching into the landing pad 123(BP).

Figure 3L:
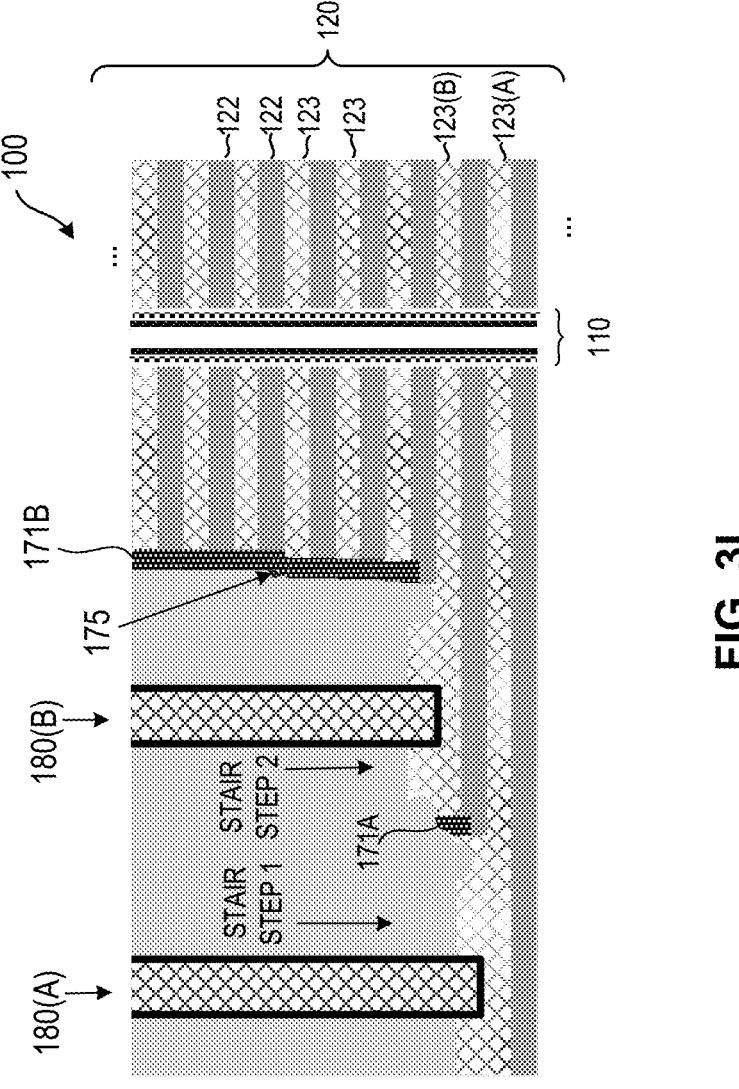

FIG. 3L shows a cross-sectional view of the semiconductor device 100 after contact structures are formed. In some examples, conductive material(s), such as titanium (Ti), titanium nitride (TiN), tungsten can be used to fill the contact holes, and suitably planarization process, such as CMP process can be used to remove excess conductive material(s) and planarize the surface. In the FIG. 3L example, a contact structure 180(A) is formed on the stair step 1, the contact structure 180(A) is conductively connected with the gate layer 123(A). Further, a contact structure 180(B) is formed on the stair step 2, the contact structure 180(B) is conductively connected with the gate layer 123(B).

It is noted that additional process(es), such as backend processes that form routing wires, passivation layer(s), and the like can be performed afterwards.

Figure 4:
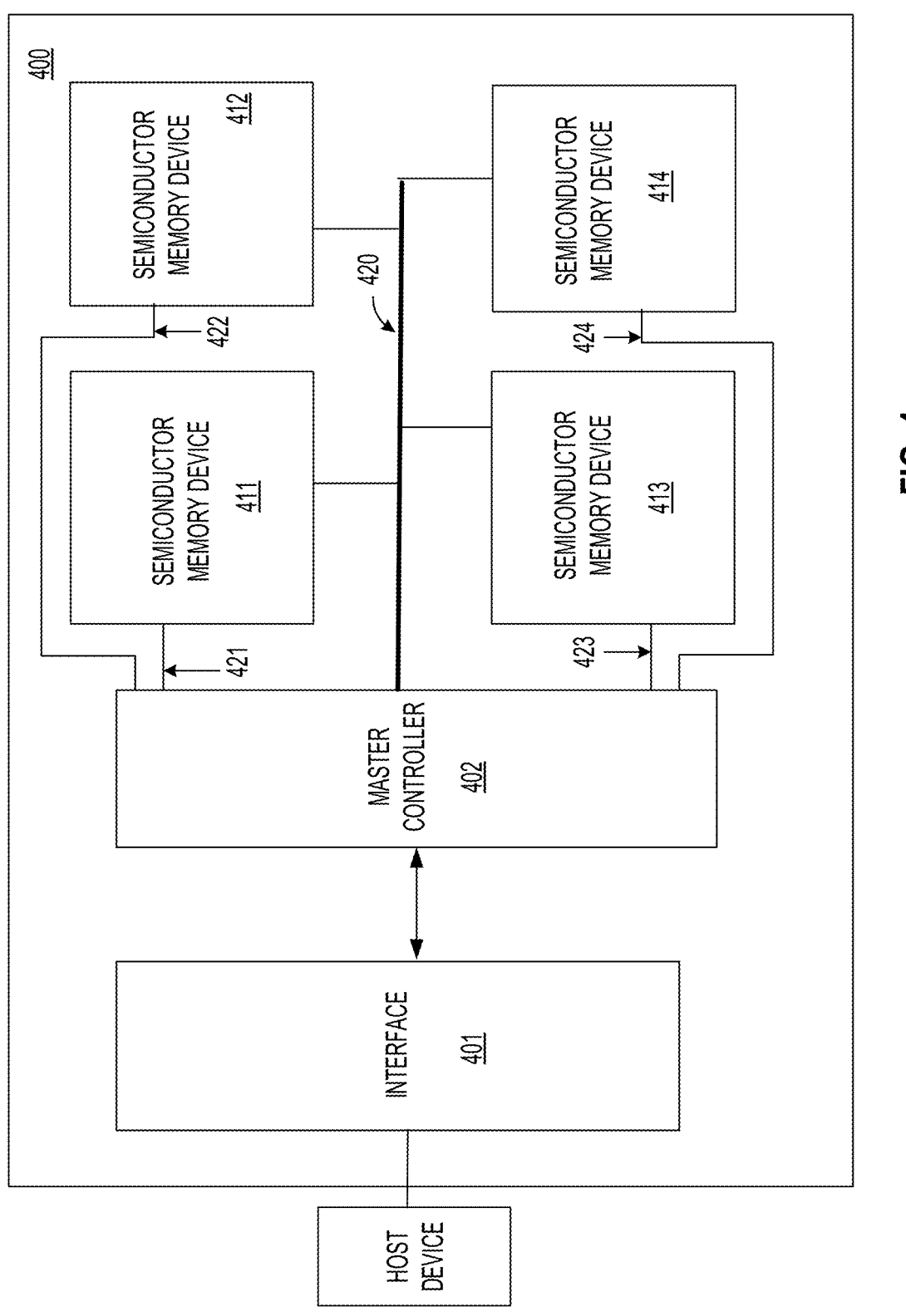
FIG. 4 shows a block diagram of a memory system device according to some examples of the disclosure.

FIG. 4 shows a block diagram of a memory system device 400 according to some examples of the disclosure. The memory system device 400 includes one or more semiconductor memory devices, such as shown by semiconductor memory devices 411-414, that are respectively configured similarly as the semiconductor device 100. In some examples, the memory system device 400 is a solid state drive (SSD).

The memory system device 400 includes other suitable components. For example, the memory system device 400 includes an interface 401 and a master controller 402 coupled together as shown in FIG. 4. The memory system device 400 can include a bus 420 that couples the master controller 402 with the semiconductor memory devices 411-414. In addition, the master controller 402 is connected with the semiconductor memory devices 411-414 respectively, such as shown by respective control lines 421-424.

The interface 401 is suitably configured mechanically and electrically to connect between the memory system device 400 and a host device, and can be used to transfer data between the memory system device 400 and the host device.

The master controller 402 is configured to connect the respective semiconductor memory devices 411-414 to the interface 401 for data transfer. For example, the master controller 402 is configured to provide enable/disable signals respectively to the semiconductor memory devices 411-414 to active one or more semiconductor memory devices 411-414 for data transfer.

The master controller 402 is responsible for the completion of various instructions within the memory system device 400. For example, the master controller 402 can perform bad block management, error checking and correction, garbage collection, and the like.

The foregoing outlines features of several examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a memory stack of gate layers and insulating layers, the gate layers and the insulating layers being stacked alternatingly and being formed into stair steps in a staircase region;
a first landing pad on a first gate layer of a first stair step, the first gate layer being a top gate layer of the first stair step; and
a first sidewall isolation structure on a riser sidewall of a second gate layer of a second stair step, the second gate layer being a top gate layer of the second stair step and being stacked on the first gate layer in the memory stack, the first sidewall isolation structure isolating the second gate layer from the first landing pad, wherein
the first sidewall isolation structure is in direct contact with the second gate layer and the first landing pad,
the first landing pad has a recessed area having a sidewall structure that is in direct contact with the first sidewall isolation structure, and
the recessed area is filled with a dielectric material.

2. The semiconductor device of claim 1, further comprising:
a second landing pad on the second gate layer of the second stair step, a sidewall of the second landing pad being covered by a different isolation layer from the first sidewall isolation structure.

3. The semiconductor device of claim 2, wherein the different isolation layer is a contact isolation layer in the staircase region, the contact isolation layer covers the first landing pad and the second landing pad.

4. The semiconductor device of claim 3, further comprising:
a first contact structure extending through the contact isolation layer and being connected with the first gate layer of the first stair step; and
a second contact structure extending through the contact isolation layer and being connected with the second gate layer of the second stair step.

5. The semiconductor device of claim 3, wherein the first sidewall isolation structure and the contact isolation layer are of different material properties.

6. The semiconductor device of claim 5, wherein the first sidewall isolation structure is formed of atomic layer deposition (ALD) silicon dioxide, and the contact isolation layer is formed of high density plasma silicon dioxide.

7. The semiconductor device of claim 1, further comprising:
a second sidewall isolation structure on a sidewall of multiple gate layers and insulating layers in the memory stack.

8. The semiconductor device of claim 7, wherein a width of the first sidewall isolation structure and the second sidewall isolation structure is in a range of 1 nm to 500 nm.

9. The semiconductor device of claim 7, further comprising:
a silicon nitride material on the second sidewall isolation structure.

10. The semiconductor device of claim 1, wherein the recessed area comprises an isotropic recess.

11. The semiconductor device of claim 1, wherein the sidewall structure is curved or beveled.

12. The semiconductor device of claim 2, further comprising:
a second sidewall isolation structure on a sidewall of multiple gate layers and insulating layers in the memory stack.

13. The semiconductor device of claim 12, wherein a width of the first sidewall isolation structure and the second sidewall isolation structure is in a range of 1 nm to 500 nm.

14. The semiconductor device of claim 12, further comprising:
a silicon nitride material on the second sidewall isolation structure.

15. The semiconductor device of claim 2, wherein the recessed area comprises an isotropic recess.

16. The semiconductor device of claim 2, wherein the sidewall structure is curved or beveled.

17. A memory system device, comprising:

a controller coupled to a semiconductor memory device to control data storage operations on the semiconductor memory device; and the semiconductor memory device comprising:

a memory stack of gate layers and insulating layers, the gate layers and the insulating layers being stacked alternatingly and being formed into stair steps in a staircase region;

a first landing pad on a first gate layer of a first stair step, the first gate layer being a top gate layer of the first stair step; and a first sidewall isolation structure on a riser sidewall of a second gate layer of a second stair step, the second gate layer being a top gate layer of the second stair step and being stacked on the first gate layer in the memory stack, the first sidewall isolation structure isolating the second gate layer from the first landing pad, wherein the first sidewall isolation structure is in direct contact with the second gate layer and the first landing pad, the first landing pad has a recessed area having a sidewall structure that is in direct contact with the first sidewall isolation structure, and the recessed area is filled with a dielectric material.

18. The memory system device of claim 17, further comprising:

a second landing pad on the second gate layer of the second stair step, a sidewall of the second landing pad being covered by a different isolation layer from the first sidewall isolation structure.

19. The memory system device of claim 18, wherein the different isolation layer is a contact isolation layer in the staircase region, the contact isolation layer covers the first landing pad and the second landing pad.

20. The memory system device of claim 19, further comprising:

a first contact structure extending through the contact isolation layer and being connected with the first gate layer of the first stair step; and a second contact structure extending through the contact isolation layer and being connected with the second gate layer of the second stair step.

* * * * *